(12) United States Patent
Kitayama

(10) Patent No.: US 8,588,023 B2
(45) Date of Patent: Nov. 19, 2013

(54) SEMICONDUCTOR MEMORY DEVICE HAVING SELECTIVE ACTIVATION CIRCUIT FOR SELECTIVELY ACTIVATING CIRCUIT AREAS

(75) Inventor: Makoto Kitayama, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 13/463,902

(22) Filed: May 4, 2012

(65) Prior Publication Data

US 2012/0224447 A1 Sep. 6, 2012

Related U.S. Application Data

(62) Division of application No. 12/639,730, filed on Dec. 16, 2009, now abandoned.

(30) Foreign Application Priority Data

Dec. 17, 2008 (JP) ................................. 2008-320637

(51) Int. Cl.
*G11C 8/00* (2006.01)
(52) U.S. Cl.
USPC .................................................. 365/230.03
(58) Field of Classification Search
USPC .................................................. 365/230.03
See application file for complete search history.

(56) References Cited

U.S. PATENT DOCUMENTS

| 6,229,384 B1 | 5/2001 | Ohsawa |
| 6,233,195 B1 | 5/2001 | Yamazaki et al. |
| 6,262,939 B1 | 7/2001 | Matsui |
| 2004/0004899 A1* | 1/2004 | Choi ........................ 365/230.06 |
| 2004/0196719 A1* | 10/2004 | Aritomi et al. ................ 365/222 |

FOREIGN PATENT DOCUMENTS

JP 11-031385 A 2/1999

* cited by examiner

*Primary Examiner* — Anthan Tran
(74) *Attorney, Agent, or Firm* — Sughrue Mion, PLLC

(57) ABSTRACT

A semiconductor memory device includes a plurality of memory banks each including a plurality of circuit areas selected based on an address signal, any one of which is selected by a corresponding bank selective signal (source transistor control signals), and a selective activation circuit that, from among circuit areas included in a memory bank that is selected based on the bank selective signal, activates any one of the circuit areas based on the address signal, and deactivates at least one of rest of the circuit areas. According to the present invention, the power consumption can be reduced in an active state by a dynamic power control in response to an address signal, not by entire power control by an external command.

20 Claims, 14 Drawing Sheets

SEMICONDUCTOR MEMORY DEVICE HAVING SELECTIVE ACTIVATION CIRCUIT FOR SELECTIVELY ACTIVATING CIRCUIT AREAS

This application is a divisional application of U.S. application Ser. No. 12/639,730 filed Dec. 16, 2009, which claims priority from Japanese Patent Application No. 2008-320637 filed Dec. 17, 2008, which applications are incorporated herein by reference.

BACKGROUND OF THE INVENTION

1. Field of the Invention

The present invention relates to a semiconductor memory device, and particularly relates to a semiconductor memory device in which power consumption is reduced.

2. Description of Related Art

In recent years, the operation voltage of a semiconductor device is gradually lowered in order to reduce its power consumption. At present, a considerably low operation voltage on the order of 1 volt is often used. However, as the operation voltage is lowered, because it is required to lower the threshold voltage in proportion to the decrease of the operation voltage, it causes a problem that the sub-threshold current of the transistor is increased in a non-conductive state.

To deal with such problems, there has been proposed a method for a semiconductor device disclosed in Japanese Patent Application Laid-open No. H11-31385, which has a structure in which a power source line of a circuit area where logic is fixed at a standby time is divided into a main power source line and a sub power source line. That is, in an active state, the main power source line and the sub power source line are short-circuited so that the power is supplied to both of the lines, thus correctly supplying the operation voltage to the circuit area. On the other hand, in a standby state, the main power source line and the sub power source line are disconnected so that no power is supplied to the sub power source line, thus terminating a power supply to a transistor that does not contribute to maintaining fixed logic that is determined beforehand.

As a result, even when a transistor having a low threshold is used, the power consumption is reduced because the sub-threshold current is reduced in the standby state. In addition, because a switching speed of the transistor having a low threshold is high, a high speed operation of a semiconductor device can be achieved in the active state. That is, it is possible to achieve both the high speed operation and the low power consumption in the semiconductor device.

In a case of applying a low power technology using such a sub power source line as described above to a semiconductor memory device such as a DRAM (Dynamic Random Access Memory), the main power source line and the sub power source line can be disconnected in a period during which the circuit area is in the standby state in response to an external command supplied from outside.

However, if the main power source line and the sub source line are merely disconnected during the period during which the circuit area is in the standby state in response to the external command, it only controls whether to enter the entire chip in the standby mode or to enter the entire chip in the active state. That is, it is not possible to control to enter only a part of an internal circuit in the standby state and to disconnect the main power source line and the sub power source line only in the corresponding circuit portion. Therefore, the power consumption cannot be reduced to a satisfactory extent, and a semiconductor memory device that can further reduce the power consumption has been desired.

SUMMARY

The present invention seeks to solve one or more of the above problems, or to improve upon those problems at least in part.

In one embodiment, there is provided a semiconductor memory device comprising: a plurality of memory banks each including a plurality of circuit areas selected based on an address signal, any one of the memory banks being selected by a corresponding bank selective signal; and a selective activation circuit that activates any one of the circuit areas and deactivates at least one of remaining circuit areas based on the address signal included in a memory bank that is selected based on the bank selective signal.

In another embodiment, there is provided a semiconductor memory device comprising: a memory bank that includes a plurality of memory cells each connected to an associated one of word lines and an associated one of bit lines; a row decoder that includes a plurality of word drivers and performs selection of the word lines based on a row address; a column decoder that performs selection of the bit lines based on a column address; and a selective activation circuit that activates any one of the word drivers and deactivates remaining word drivers based on the row address, wherein each of the word drivers includes a main power source line, a sub power source line, a switch circuit connected between the main power source line and the sub power source line, and a logic circuit that is connected to the main power source line and the sub power source line, and the selective activation circuit turns on the switch circuit that is included in one of the word drivers to be activated, and turns off the switch circuit included in the remaining word drivers to be deactivated.

The "activation" of a circuit area in the present invention means that an output signal of the circuit area can be changed in response to an address signal. That is, if the circuit area is activated, an output signal is activated when a predetermined address signal is provided and the output signal is deactivated when an address signal that is different from the predetermined address signal is provided. On the other hand, the "deactivation" means that the output signal of the circuit area is fixed regardless of the address signal. That is, if the circuit area is deactivated, the output signal is not activated even when the predetermined address signal is provided. Of course, the output signal is not activated either when an address signal that is different from the predetermined address signal is provided.

As described above, in the semiconductor memory device according to the present invention, a circuit area where an operation is required in response to an address signal is activated and a circuit area where the operation is not required is deactivated. Therefore, the power consumption can be reduced in the active state by a dynamic power control in response to an address signal, not by entire power control by an external command.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE EMBODIMENTS

Preferred embodiments of the present invention will be explained below in detail with reference to the accompanying drawings.

Figure 1:
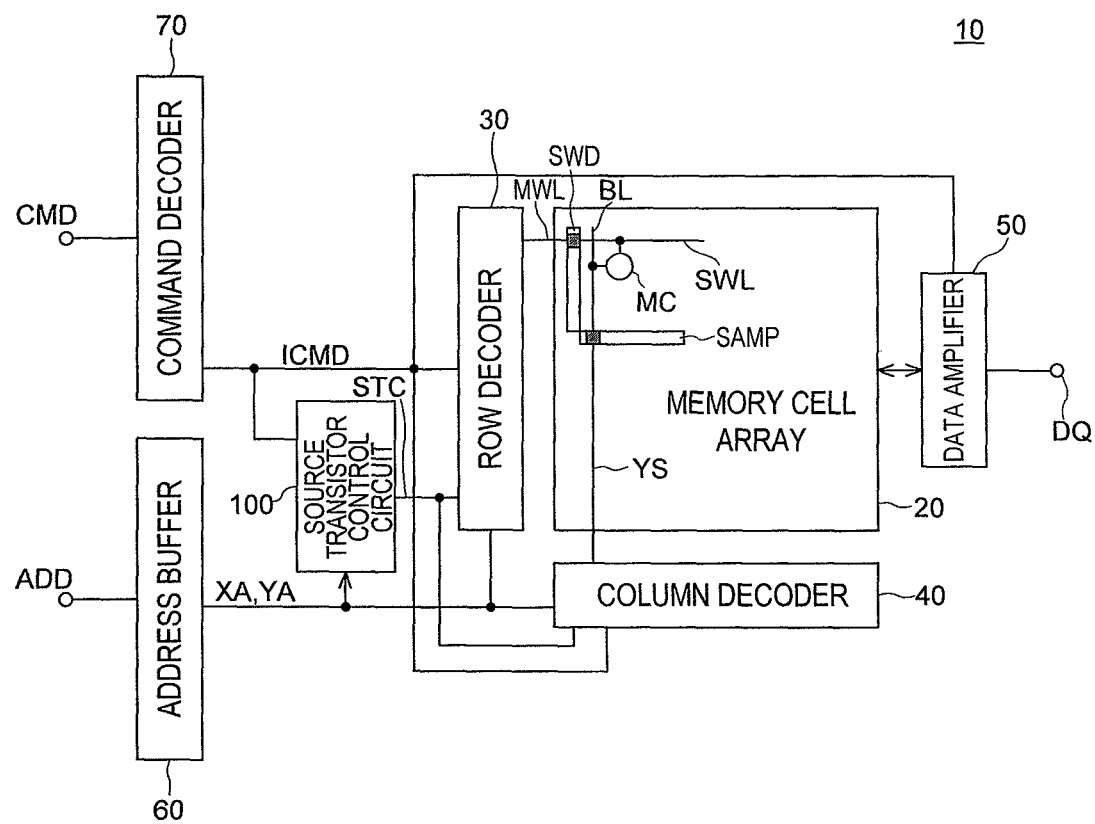
FIG. 1 is an overall block diagram of a semiconductor memory device 10 according to a first embodiment of the present invention.

FIG. 1 is an overall block diagram of a semiconductor memory device 10 according to a first embodiment of the present invention.

As shown in FIG. 1, the semiconductor memory device 10 includes a memory cell array 20 that includes a plurality of memory cells, a row decoder 30 that performs a row access to the memory cell array 20, and a column decoder 40 that performs a column access to the memory cell array 20. The memory cell array 20 includes a sub-word line SWL, a bit line BL, and a memory cell MC that is connected to the sub-word line SWL and the bit line BL. The sub-word line SWL is connected to a sub-word driver SWD that is controlled by a main-word signal on a main-word line MWL. The bit line BL is connected to a sense amplifier SAMP that is selected by a column selection signal on a column selection line YS. Selection of the main-word line MWL and the sub-word line SWL is performed by the row decoder 30 based on a row address signal XA. Selection of the column selection line YS and the bit line BL is performed by the column decoder 40 based on a column address signal YA. The memory cell MC that is selected by the selection of the sub-word line SWL and the selection of the bit line BL is connected to a data amplifier 50, by which an output of read data and an input of write data can be performed via a data input/output terminal DQ.

Both the row address signal XA that is supplied to the row decoder 30 and the column address signal YA that is supplied to the column decoder 40 are supplied from outside via an address terminal ADD. The row address signal XA and the column address signal YA are supplied to the row decoder 30 and the column decoder 40, respectively, via an address buffer 60. Among address signals supplied to the address terminal ADD, an address signal supplied in synchronization with an active command is the row address signal XA, and an address signal supplied in synchronization with a read command or a write command is the column address signal YA. Therefore, the row address signal XA that is supplied in synchronization with the active command is supplied to the row decoder 30 via the address buffer 60, and the column address signal YA that is supplied in synchronization with the read command or the write command is supplied to the column decoder 40 via the address buffer 60.

The various commands described above are supplied from the outside via a command terminal CMD, and are supplied to a command decoder 70. The command decoder 70 is a circuit that interprets the command supplied via the command terminal CMD, which generates various types of internal commands ICMD based on a result of interpretation. The generated internal commands ICMD are supplied to each corresponding circuit block.

As shown in FIG. 1, one of the circuits to which the internal commands ICMD are supplied is a source transistor control circuit (bank control circuit) 100. The source transistor control circuit 100 is a circuit that generates a source transistor control signal STC based on an address signal and a command. The source transistor control signal STC is a signal for activating, from among the memory cell array 20, a circuit area that is related to a memory bank, which is an access target, and deactivating a circuit area that is related to a memory bank, which is not the access target. That is, the source transistor control signal STC is a bank selective signal.

Figure 2:
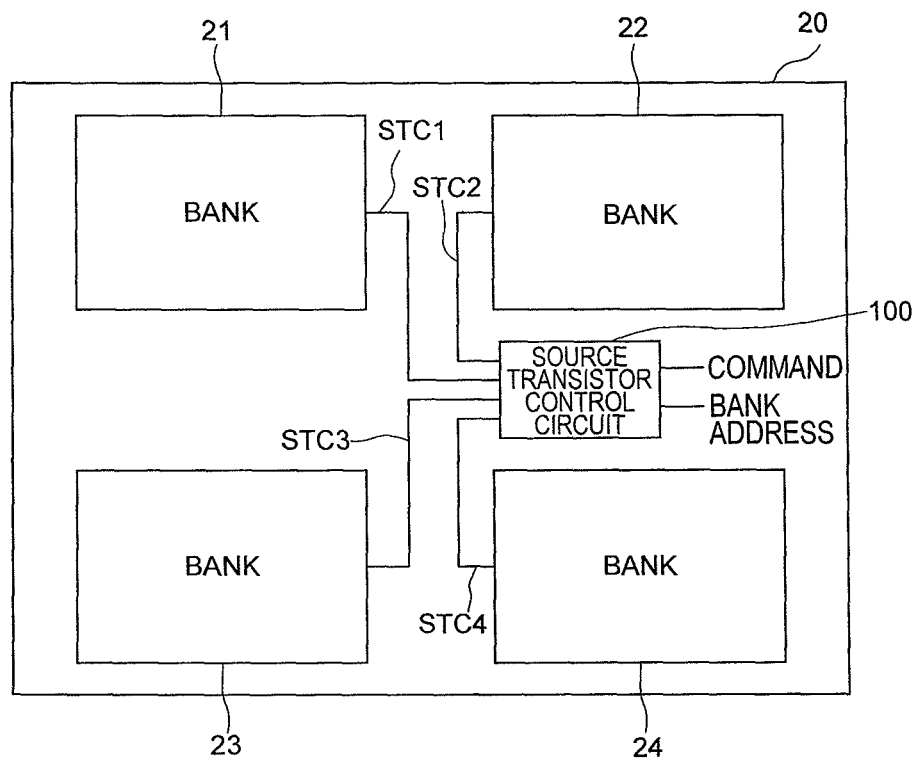
FIG. 2 is a block diagram of a bank configuration of the memory cell array 20.

FIG. 2 is a block diagram of a bank configuration of the memory cell array 20.

As shown in FIG. 2, in the first embodiment, the memory cell array 20 is divided into four memory banks 21 to 24. Selection of a memory bank is performed by a bank address that is a part of the row address signal XA. That is, the source transistor control circuit 100 receives a command and a bank address, and based on the received command and bank address, activates any one of source transistor control signal STC1 to STC4 corresponding to the memory banks 21 to 24, respectively.

Figure 3:
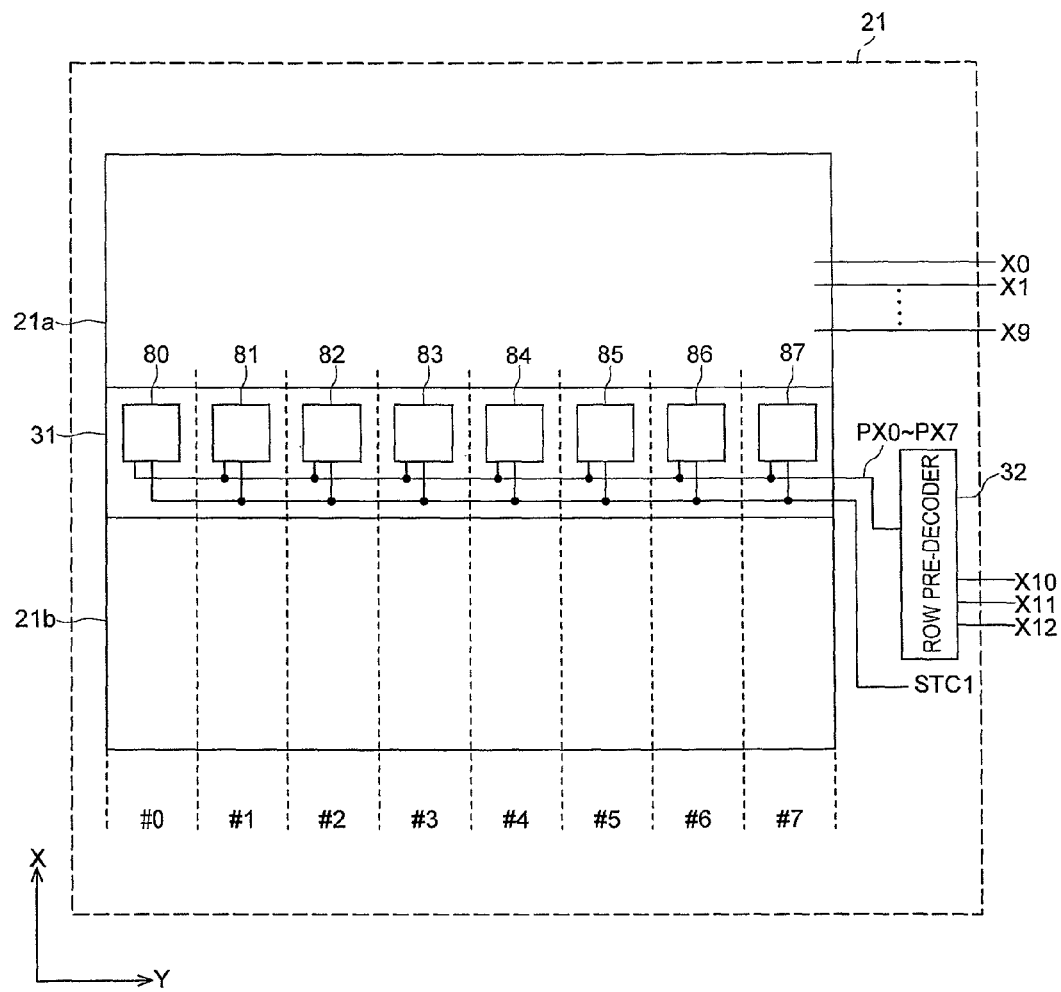
FIG. 3 is an enlarged diagram of pain parts of the memory bank 21.

FIG. 3 is an enlarged diagram of pain parts of the memory bank 21.

As shown in FIG. 3, the memory bank 21 includes memory cell areas 21a and 21b that are evenly divided in an X direction. Between the memory cell areas 21a and 21b, a row decoder array 31 is arranged extending in a Y direction. The row decoder array 31 includes eight main word drivers 80 to 87 (eight circuit areas). The main word drivers 80 to 87 are circuits that activates corresponding main word lines (not shown), respectively. Furthermore, the memory bank 21 is configured with memory areas #0 to #7 that are evenly divided in the Y direction. The activation of the main word line enables corresponding one of the memory areas #0 to #7 to be accessed.

In the first embodiment, the row address signal XA that is supplied to the memory bank 21 is divided into a 10-bit lower address consisting of X0 to X9 and a 3-bit upper address consisting of X10 to X12. The upper addresses X10 to X12 are supplied to a row pre-decoder 32, by which any one bit of an 8-bit pre-decode signals PX0 to PX7 is activated. In the example shown in FIG. 3, the row decoder array 31 and the row pre-decoder 32 are components included in the memory bank 21. However, the present invention is not limited thereto, and the row decoder array 31 and the row pre-decoder 32 can be circuit blocks that constitute the row decoder 30 shown in FIG. 1. In this case, the row pre-decoder 32 can be provided such that it is shared by the memory banks 21 to 24.

The pre-decode signals PX0 to PX7 are signals for selecting the main word drivers 80 to 87, respectively. As described above, because only one bit is activated from among the 8-bit pre-decode signals PX0 to PX7, only one main word driver is activated from among the main word drivers 80 to 87. This means that only one memory area is accessed from among the memory areas #0 to #7, and the rest of seven memory areas are not accessed.

Meanwhile, the lower addresses X0 to X9 are pre-decoded by a row pre-decoder (not shown), and then a part of the lower address is commonly supplied to the main word drivers 80 to 87. The other part of the lower address is supplied to a sub-word driver (not shown) that is arranged in the memory bank 21. That is, any one of the memory areas #0 to #7 is selected by the upper addresses X10 to X12, and any one of sub-word lines included in the selected one of the memory areas #0 to #7 is selected by the lower addresses X0 to X9.

Although the row decoder array 31 is arranged at the center of the memory bank 21 that is divided into two parts in the example shown in FIG. 3, the present invention is not limited thereto. Thus, the row decoder array 31 can be arranged along a side of the memory bank without dividing the memory bank 21. Alternatively, the row decoder array 31 can be divided into two or more columns and arranged in the memory bank 21 that is divided into three or more areas. In addition, the upper address to be pre-decoded is not necessarily to be 3 bits.

The other memory banks 22 to 24 have the same configuration as the memory bank 21 described above.

Figure 4:
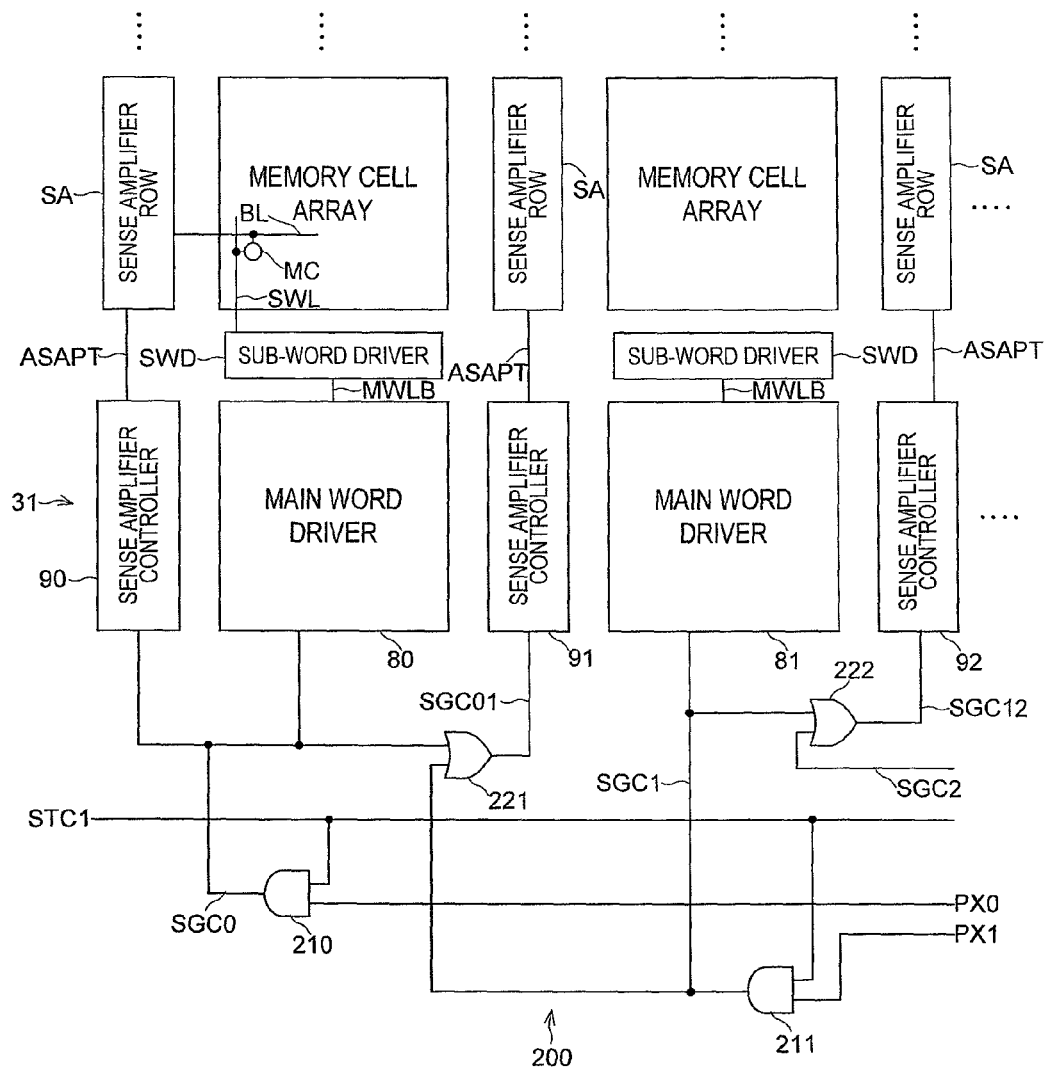
FIG. 4 shows the row decoder array 31 and its peripheral circuits in detail.

FIG. 4 shows the row decoder array 31 and its peripheral circuits in detail.

As shown in FIG. 4, in the row decoder array 31, a plurality of the main word drivers 80, 81, . . . are arranged in the Y direction, and sense amplifier controllers 90, 91, 92, . . . are respectively arranged on both sides of the main word driver in the Y direction. As described above, the main word drivers 80, 81, . . . are circuits for activating their corresponding main word lines MWLB, and each of the main word lines MWLB is supplied to a sub-word driver SWD arranged at its corresponding one of the memory areas #0 to #7. The sense amplifier controllers 90, 91, 92, . . . are circuits for respectively activating their corresponding sense amplifier control signals ASAPT, and each of the sense amplifier control signals ASAPT is supplied to a sense amplifier SA arranged at its corresponding one of the memory areas #0 to #7.

The main word drivers 80, 81, . . . are respectively activated based on their corresponding source gate control signals SGC0, SGC1, . . . . On the other hand, the sense amplifier controllers 90, 91, 92, . . . are activated simultaneously when the adjacent main word driver is activated. Therefore, the source gate control signal SGC0 is supplied as it is to the sense amplifier controller 90 that is located at the edge, and an OR signal SGC01 of the source gate control signals SGC0 and SGC1 is supplied to the sense amplifier controller 91 that is sandwiched by the main word drivers 80 and 81.

Such source gate control signals SGC0, SGC1, . . . , and SGC01, SGC12, . . . are generated by a selective activation circuit 200 shown in FIG. 4. The selective activation circuit 200 is a logic circuit that generates the source gate control signals SGC0, SGC1, . . . based on the source transistor control signal STC 1 and the pre-decode signals PX0, PX1, . . . .

As shown in FIG. 4, the selective activation circuit 200 according to the first embodiment includes AND gates 210, 211, . . . that respectively take logical products of the source transistor control signal STC1 and the pre-decode signals PX0, PX1, . . . , and their outputs are the source gate control signals SGC0, SGC1, . . . , respectively. As described above, the source gate control signals SGC0, SGC1, . . . are respectively supplied to their corresponding main word drivers 80, 81, . . . , and at the same time, the two adjacent source gate signals SGC0, SGC1, . . . are subject to logical sums by OR gates 221, 222, . . . , respectively so that their outputs SGC01, SGC12, . . . are supplied to the sense amplifier controllers 91, 92, . . . (other than the sense amplifier controller located at the edge).

With this configuration, any one of the word drivers is activated based on the pre-decode signals PX0 to PX7 from among the main word drivers 80, 81, . . . that are included in a memory bank selected based on the source transistor control signals STC1 to STC3 that are the bank selective signals, and at the same time, the rest of the word drivers are all deactivated. In addition, as for the sense amplifier controllers 90, 91, 92, . . . , only the two sense amplifier controllers adjacent to an activated word driver are activated, and at the same time, the rest of the sense amplifier controllers are all deactivated. Therefore, only one main word driver and two sense amplifier controllers that are related to a memory area, which is the access target, are activated, while the others are deactivated.

Figure 5:
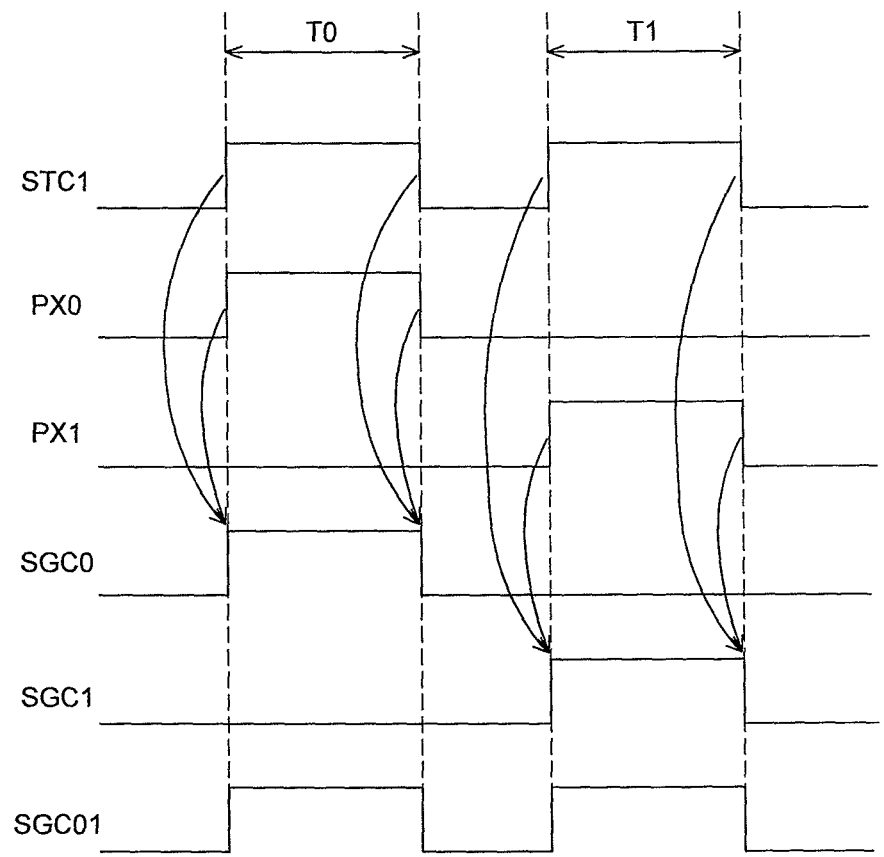
FIG. 5 is a timing chart for explaining an operation of the selective activation circuit 200.

FIG. 5 is a timing chart for explaining an operation of the selective activation circuit 200.

As shown in FIG. 5, when an access to the memory bank 21 is requested based on the address signal and the command, the source transistor control signal STC 1 is activated regardless that which memory area included in the memory bank 21 is selected. On the other hand, any one bit of the pre-decode signals PX0 to PX7 is activated based on the upper addresses X10 to X12 of the row address XA. In the example shown in FIG. 5, the pre-decode signal PX0 is activated for a period T0, and the pre-decode signal PX1 is activated for a period T1. The source transistor control signal STC1 is activated for both the periods T0 and T1.

Because the AND gates 210, 211, . . . that respectively take the logical products of the source transistor control signal STC1 and the pre-decode signals PX0, PX1, . . . are provided in the selective activation circuit 200, the source gate control signal SGC0 is activated for the period T0, and the source gate control signal SGC1 is activated for the period T1. Therefore, for the period T0, only the main word driver 80 is activated, and the other main word drivers 81 to 87 are maintained in a deactivation state. Similarly, for the period T1, only the main word driver 81 is activated, and the other main word drivers 80, 82 to 87 are maintained in a deactivation state.

Furthermore, because the OR gates 221, 222, . . . that respectively take the logical sums of two source gate control signals SGC0, SGC1, . . . are provided in the selective activation circuit 200, the source gate control signal SGC01 is activated for both the periods T0 and T1. As described above, the source gate control signal SGC0 is supplied as it is to the sense amplifier controller 90. Therefore, for the period T0, only the sense amplifier controllers 90 and 91 are activated, and the other sense amplifier controllers 92 to 98 are maintained in a deactivation state. Similarly, for the period T1, only the sense amplifier controllers 91 and 92 are activated, and the other sense amplifier controllers 90 and 93 to 98 are maintained in a deactivation state.

Figure 6:
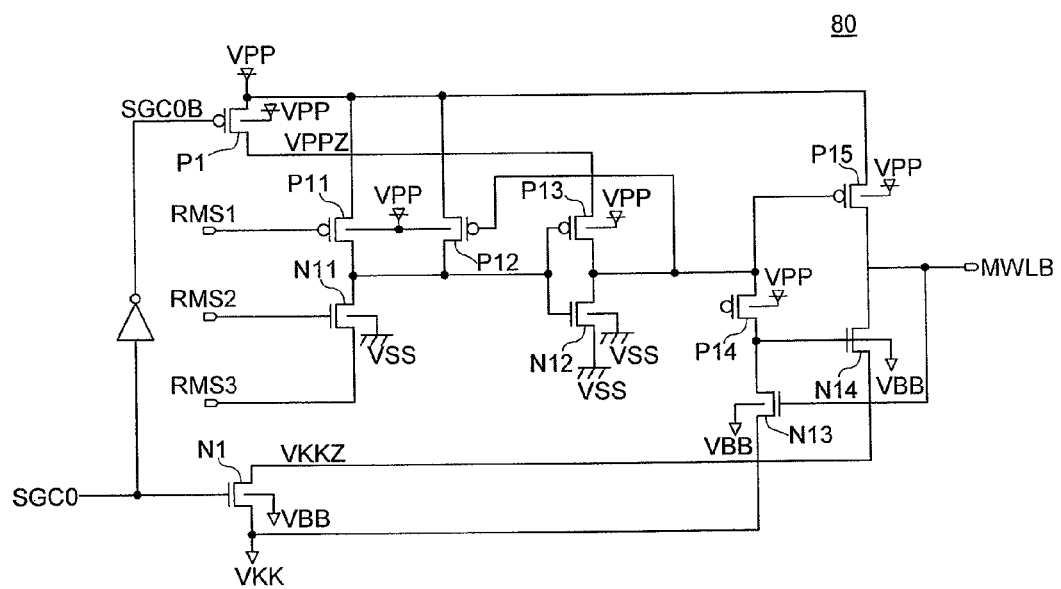
FIG. 6 is a circuit diagram of the main word driver 80.

FIG. 6 is a circuit diagram of the main word driver 80.

As shown in FIG. 6, the main word driver 80 is a logic circuit that receives internal signals RMS1 to RMS3, and drives the main word line MWLB. The internal signals RMS1 to RMS3 are signals (pre-decode signals) generated based on the row address XA.

Among P-channel MOS transistors P11 to P15 that constitute the logic of the main word driver 80, the sources of the transistors P11, P12, and P15 are connected to a main power source line VPP, and the source of the transistor P13 is connected to a sub power source line VPPZ. A PMOS source transistor P1 as a switch is connected between the main power source line VPP and the sub power source line VPPZ. An inversion signal SGC0B of the source gate control signal SGC0 is supplied to the gate of the transistor P1. Therefore, if the level of the source gate control signal SGC0 is High (an activation state), the main power source line VPP and the sub power source line VPPZ are short-circuited, so that the same potential is supplied to the sub power source line VPPZ as that supplied to the main power source line VPP. On the other hand, if the level of the source gate control signal SGC0 is Low (a deactivation state), the main power source line VPP and the sub power source line VPPZ are disconnected, so that no power is supplied to the sub power source line VPPZ.

Furthermore, from among N-channel MOS transistors N11 to N14 that constitute the logic of the main word driver 80, the sources of the transistors N12 and N13 are connected to a main power source line VSS or VKK, and the source of the transistor N14 is connected to a sub power source line VKKZ. An NMOS source transistor N1 as a switch is connected between the main power source line VKK and the sub power source line VKKZ. The source gate control signal SGC0 is supplied to the gate of the transistor N1. Therefore, if a level of the source gate control signal SGC0 is High (an activation state), the main power source line VKK and the sub power source line VKKZ are short-circuited, so that the same potential is supplied to the sub power source line VKKZ as that supplied to the main power source line VKK. On the other hand, if the level of the source gate control signal SGC0 is Low (a deactivation state), the main power source line VKK and the sub power source line VKKZ are disconnected, so that no power is supplied to the sub power source line VKKZ.

The transistors connected to the main power source lines VPP, VSS, and VKK are transistors that are required to fix the logic of the main word driver in a deactivation state (transistors to be turned ON), and the transistors connected to the sub power source lines VPPZ and VKKZ are transistors that are not required to fix the logic of the main word driver in the deactivation state (transistors to be turned OFF). Therefore, if the source gate control signal SGC0 is deactivated, no power is supplied to the sources of the transistors that are not required to fix the logic, so that there is virtually no power consumption due to the sub-threshold current in a deactivation state. As a result, it is possible to reduce the power consumption in a deactivation state while utilizing a high speed transistor having a low threshold voltage.

The other main word drivers 81 to 87 have the same circuit configuration as the main word driver 80. In addition, the main power source lines VPP, VSS, and VKK can be provided such that they are shared by the main word drivers 80 to 87.

Figure 7:
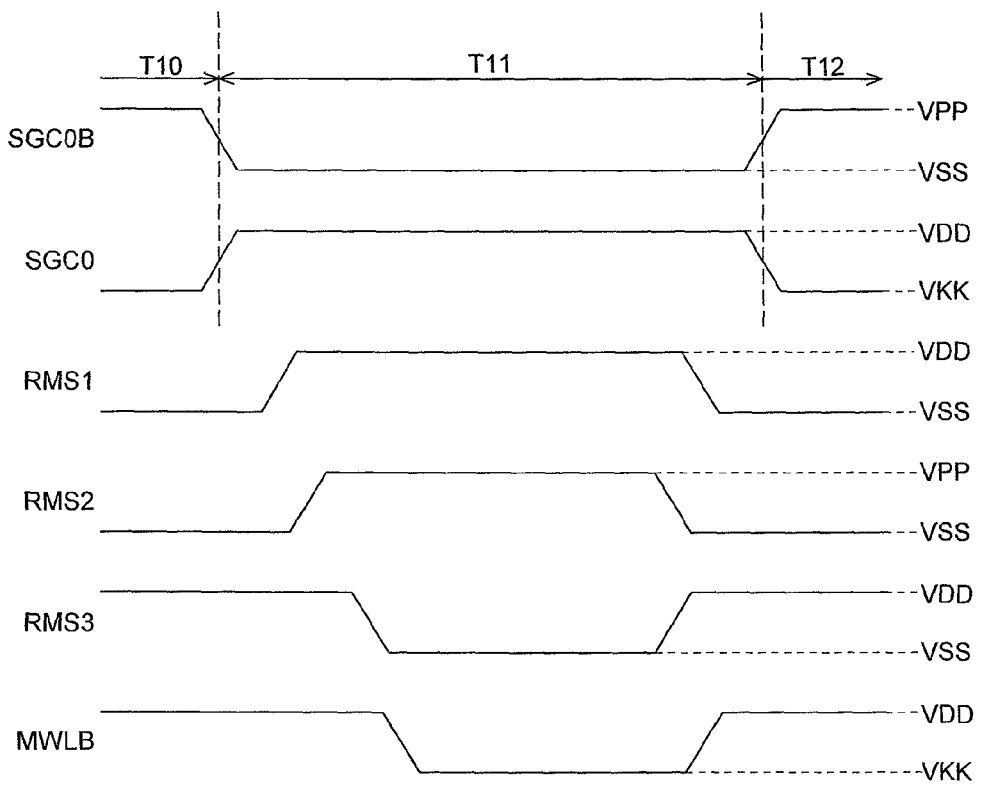
FIG. 7 is a waveform chart for explaining an operation of the main word driver 80.

FIG. 7 is a waveform chart for explaining an operation of the main word driver 80.

As shown in FIG. 7, in a period T11 for which the source gate control signal SGC0 is activated to a High level, if the levels of the internal signals RMS1 to RMS3 reach a predetermined logical level, the main word line MWLB is driven to a Low level, by which the corresponding sub-word driver SWD is in a selective state. On the other hand, even when the source gate control signal SGC0 is activated to a High level, if the levels of the internal signals RMS1 to RMS3 are logical levels that are different from the predetermined logical level, the main word line MWLB is driven to a High level, by which the corresponding sub-word driver SWD is in a non-selective state.

In periods T10 and T12 for which the source gate control signal SGC0 is deactivated to a Low level, as described above, the PMOS source transistor P1 and the NMOS source transistor N1 are turned OFF, so that the power supply to the sub power source lines VPPZ and VKKZ is terminated. Accordingly, the power consumption is greatly reduced while maintaining the main word line MWLB to a High level.

The case that the source gate control signal SGC0 is deactivated includes a case that the memory bank 21 is not an access target. In this case, because the source transistor control signal STC1 itself is in a deactivation state, the source gate control signal SGC0 is deactivated regardless of the values of the pre-decode signals PX0 to PX7. Another case is that the memory bank 21 is an access target, but the pre-decode signal PX0 is deactivated and any one of the pre-decode signals PX1 to PX7 is in an activation state. In this case, the corresponding memory area #0 is not the access target, and the power consumption of the main word driver 80 is saved, which does not need to be activated. Still another case is that the entire unit of the semiconductor memory device 10 is in a standby state by a command. In this case, all of the source gate control signals are deactivated.

Figure 8:
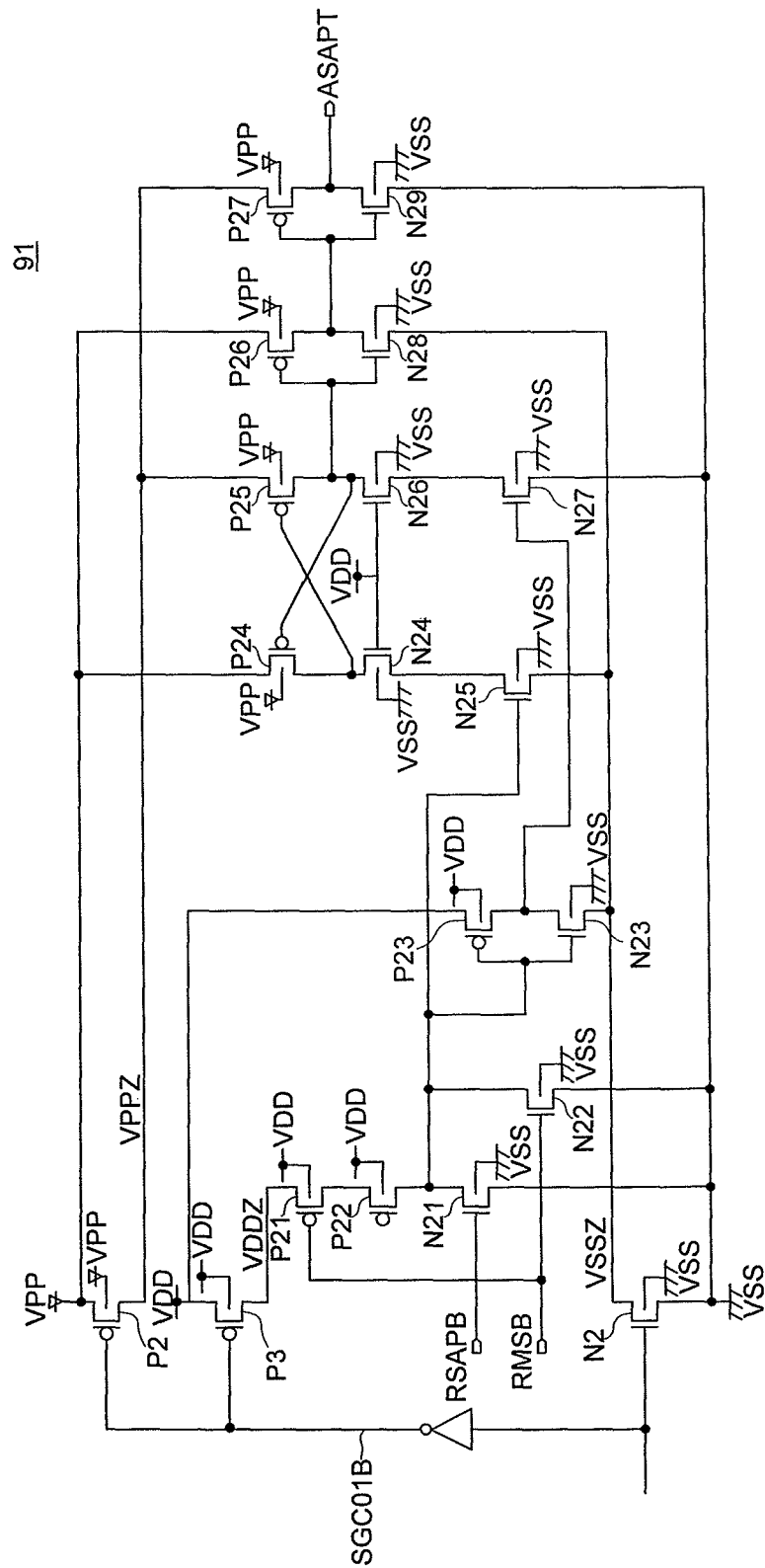
FIG. 8 is a circuit diagram of the sense amplifier controller 91.

FIG. 8 is a circuit diagram of the sense amplifier controller 91.

As shown in FIG. 8, the sense amplifier controller 91 is a logic circuit that receives internal signals RMSB and RSAPB, and controls a logical level of the sense amplifier control signal ASAPT. The internal signal RMSB is a pre-decode signal, and the internal signal RSAPB is a sense start signal.

From among P-channel MOS transistors P21 to P27 that constitute the logic of the sense amplifier controller 91, the sources of the transistors P23, P24, and P26 are connected to a main power source line VPP or VDD, and the sources of the transistors P21, P25, and P27 are connected to a sub power source line VPPZ or VDDZ. A PMOS source transistor P2 as a switch is connected between the main power source line VPP and the sub power source line VPPZ. An inversion signal SGC01B of the source gate control signal SGC01 is supplied to the gate of the transistor P2. Similarly, a PMOS source transistor P3 as a switch is connected between the main power source line VDD and the sub power source line VDDZ. An inversion signal SGC01B of the source gate control signal SGC01 is supplied to the gate of the transistor P3. Therefore, if a level of the source gate control signal SGC01 is High (an activation state), the main power source line VPP and the sub power source line VPPZ are short-circuited, so that the same potential is supplied to the sub power source line VPPZ as that supplied to the main power source line VPP. At the same time, the main power source line VDD and the sub power source line VDDZ are short-circuited, so that the same potential is supplied to the sub power source line VDDZ as that supplied to the main power source line VDD. On the other hand, if the level of the source gate control signal SGC01 is Low (a deactivation state), the main power source line VPP and the sub power source line VPPZ are disconnected, and at the same time, the main power source line VDD and the sub power source line VDDZ are disconnected, so that no power is supplied to the sub power source lines VPPZ and VDDZ.

Furthermore, from among N-channel MOS transistors N21 to N29 that constitute the logic of the sense amplifier controller 91, the sources of the transistors N21, N22, N27, and N29 are connected to a main power source line VSS, and the sources of the transistors N23, N25, and N28 are connected to a sub power source line VSSZ. An NMOS source transistor N2 as a switch is connected between the main power source line VSS and the sub power source line VSSZ. The source gate control signal SGC01 is supplied to the gate of the transistor N2. Therefore, if a level of the source gate control signal SGC01 is High (an activation state), the main power source line VSS and the sub power source line VSSZ are short-circuited, so that the same potential is supplied to the sub power source line VSSZ as that supplied to the main power source line VSS. On the other hand, if the level of the source gate control signal SGC01 is Low (a deactivation state), the main power source line VSS and the sub power source line VSSZ are disconnected, so that no power is supplied to the sub power source line VSSZ.

The transistors connected to the main power source lines VPP, VDD, and VSS are transistors that are required to fix the logic of the main word driver in the deactivation state (transistors to be turned ON), and the transistors connected to the sub power source lines VPPZ, VDDZ, and VSSZ are transistors that are not required to fix the logic of the main word driver in the deactivation state (transistors to be turned OFF). Therefore, if the source gate control signal SGC01 is deactivated, no power is supplied to the sources of the transistors that are not required to fix the logic, so that there is virtually no power consumption due to the sub-threshold current in a deactivation state. As a result, it is possible to reduce the power consumption in the deactivation state while utilizing a high speed transistor having a low threshold voltage.

The other sense amplifier controllers 90, 92 to 98 have the same circuit configuration as the sense amplifier controller 91. In addition, the main power source lines VPP, VDD, and VSS can be provided such that they are shared by the sense amplifier controllers 90 to 98.

Figure 9:
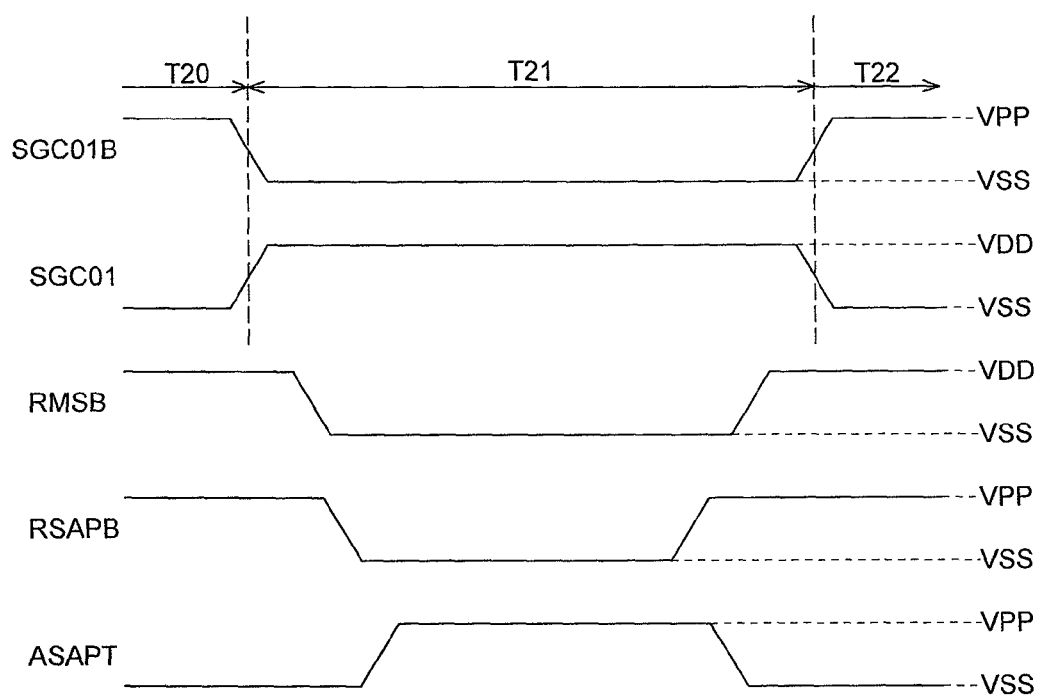
FIG. 9 is a waveform chart for explaining an operation of the sense amplifier controller 91.

FIG. 9 is a waveform chart for explaining an operation of the sense amplifier controller 91.

As shown in FIG. 9, in a period T21 for which the source gate control signal SGC01 is activated to a High level, if the levels of the internal signals RMSB and RSAPB reach a predetermined logical level, the level of the sense amplifier control signal ASAPT becomes a High level, by which a corresponding sense amplifier SA is in a selective state. On the other hand, even when the source gate control signal SGC01 is activated to a High level, if the levels of the internal signals RMSB and RSAPB are logical levels that are different from the predetermined logical levels, the sense amplifier control signal ASAPT becomes a Low level, by which the corresponding sense amplifier SA is in a non-selective state.

In periods T20 and T22 for which the source gate control signal SGC01 is deactivated to a Low level, as described above, the PMOS source transistors P2 and P3 and the NMOS source transistor N2 are turned OFF, so that the power supply to the sub power source lines VPPZ, VDDZ, and VSSZ is terminated. Therefore, the power consumption is greatly reduced while maintaining the sense amplifier control signal ASAPT to a Low level.

As described above, according to the first embodiment, the main word drivers 80 to 87 and the sense amplifier controllers 90 to 98 are selectively deactivated not only in a case that the entire unit of the semiconductor memory device 10 is in a standby state, but also in a case that the memory bank in concern is not an access target or a case that the memory bank in concern is the access target but a corresponding memory area is not the access target. That is, even during an access, because circuit areas that are not the access target can be selectively deactivated, the power consumption can be reduced as compared to the conventional case.

Figure 10:
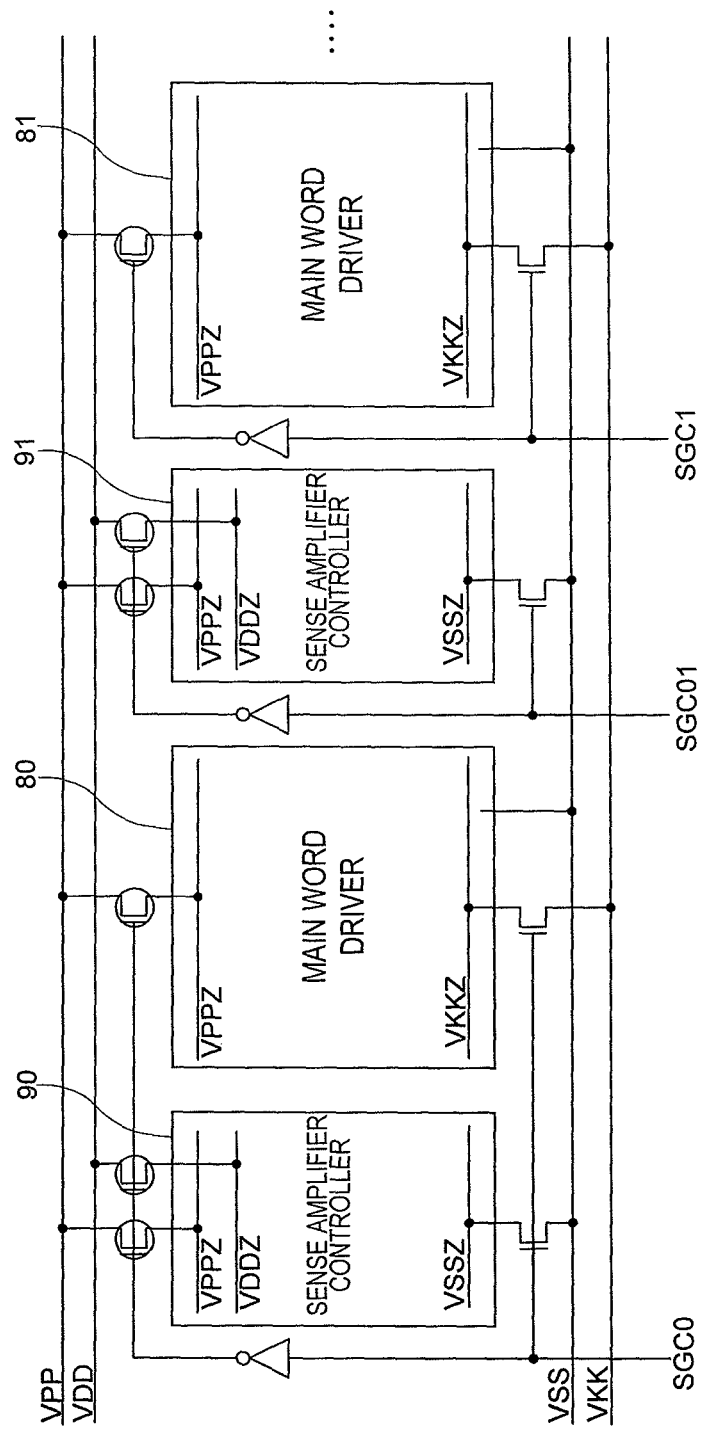
FIG. 10 is a block diagram for explaining a case that the main power source lines VPP, VDD, VSS, and VKK are shared by a plurality of main word drivers and sense amplifier controllers.

As described above, the main word drivers 80 to 87 can share the main power source lines VPP, VSS, and VKK. Similarly, the sense amplifier controllers 90 to 98 can share the main power source lines VPP, VDD, and VSS. FIG. 10 is a block diagram for explaining this case, which is a case that the main power source lines VPP, VDD, VSS, and VKK are shared by a plurality of main word drivers and sense amplifier controllers. In FIG. 10, the main power source lines VPP and VSS are provided commonly to the main word drivers 80 to 87 and the sense amplifier controllers 90 to 98. The main power source line VDD is provided commonly to the sense amplifier controllers 90 to 98. Moreover, the main power source line VKK is provided commonly to the main word drivers 80 to 87. On the other hand, the sub power source lines VPPZ, VDDZ, VSSZ, and VKKZ are provided separately for each of the main word drivers 80 to 87 and the sense amplifier controllers 90 to 98, which are not commonly connected.

A second embodiment of the present invention is explained next.

Figure 11:
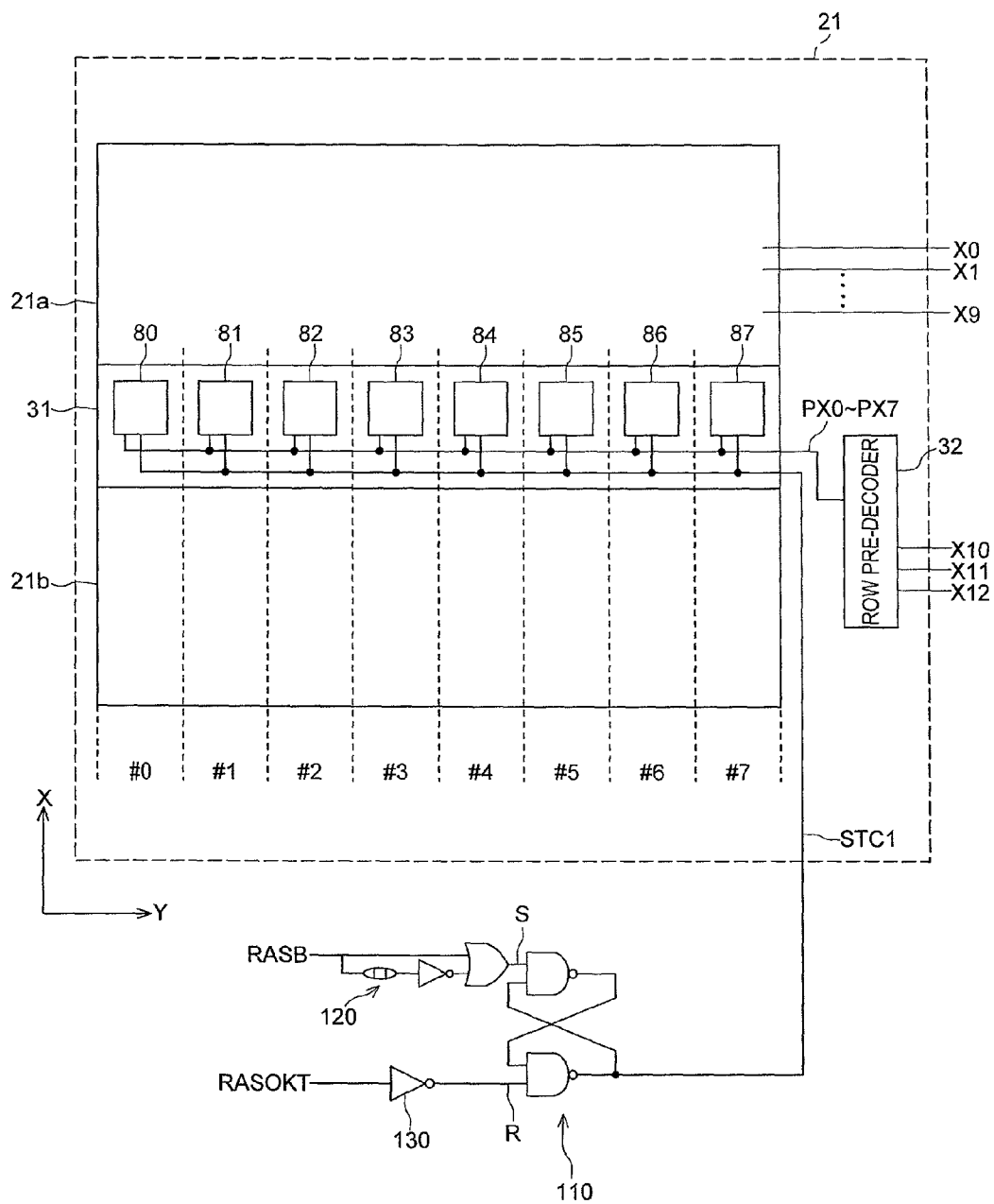
FIG. 11 is an enlarged block diagram of a memory bank 21 according to the second embodiment showing its main parts.

FIG. 11 is an enlarged block diagram of a memory bank 21 according to the second embodiment showing its main parts, and FIG. 11 corresponds to FIG. 3 for explaining the first embodiment.

As shown in FIG. 11, the second embodiment is different from the first embodiment in that the source transistor control circuit 100 includes an SR latch circuit 110 and an output of the SR latch circuit 110 is the source transistor control signal STC1. Other features of the second embodiment are identical to those of the first embedment, and thus explanations thereof will be omitted.

An internal signal RASB is supplied to a set-side input terminal S of the SR latch circuit 110 via a pulse generating circuit 120. The internal signal RASB is a signal that becomes a Low level in response to issuance of an active command. Therefore, when the active command is issued, the SR latch circuit 110 is set, by which the source transistor control signal STC 1 is activated to a High level. That is, when the active command is issued, the source transistor control signal STC1 is activated regardless of the value of the row address XA.

An internal signal RASOKT is supplied to a reset input terminal R of the SR latch circuit 110 via an inverter 130. The internal signal RASOKT is a signal that becomes a High level when a sense operation of the memory bank 21 is complete. Therefore, when the sense operation is complete, the source transistor control signal STC1 is returned to a deactivation state.

Figure 12:
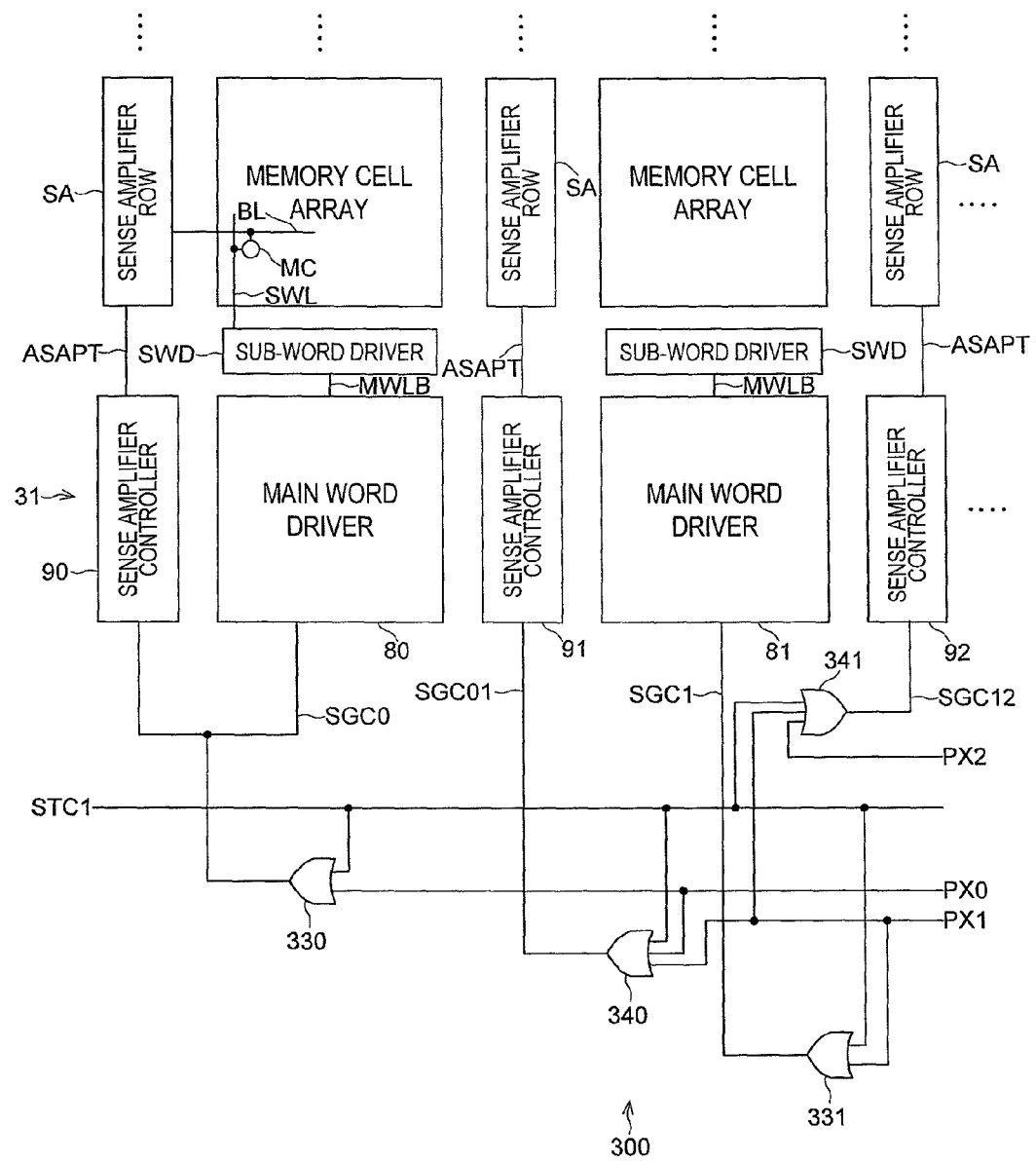
FIG. 12 shows a row decoder array 31 according to the second embodiment and its peripheral circuits in detail.

FIG. 12 shows a row decoder array 31 according to the second embodiment and its peripheral circuits in detail, and FIG. 12 corresponds to FIG. 4 for explaining the first embodiment.

Figure 13:
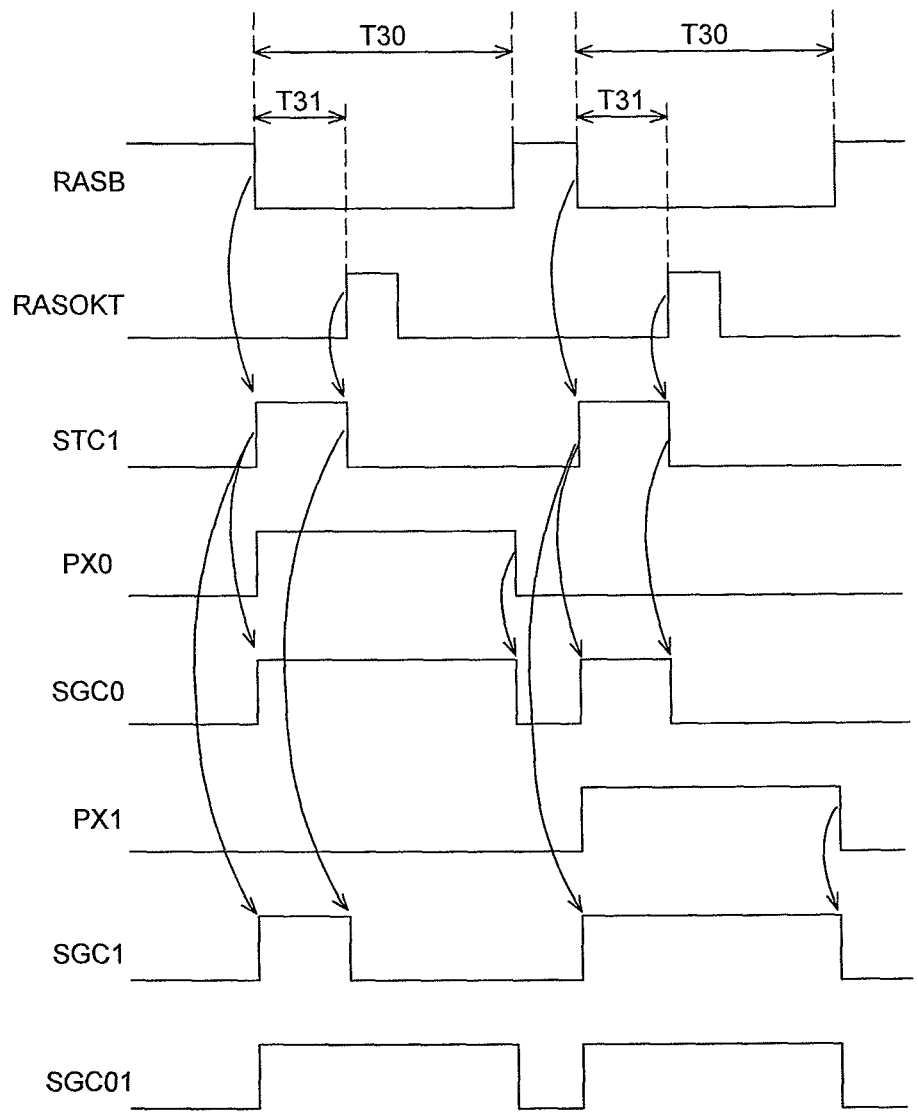
FIG. 13 shows an operation waveform of the selective activation circuit 300.

As shown in FIG. 12, a selective activation circuit 300 according to the second embodiment includes OR gates 330, 331, . . . that take logical sums of the source transistor control signal STC1 and the pre-decode signals PX0, PX1, . . . , respectively, and OR gates 340, 341, . . . that take logical sums of the source transistor control signal STC1 and a pair of the pre-decode signals PX0, PX1, . . . in order, respectively. Source gate control signals SGC0, SGC1, . . . , which are outputs of the OR gates 330, 331, . . . , are supplied to their corresponding main word drivers 80 to 87, respectively, and at the same time, supplied to sense amplifier controllers 90 and 98 (not shown) located at both edges. Source gate control signals SGC01, SGC12, which are outputs of the OR gates 340, 341, . . . , are supplied to their corresponding sense amplifier controllers 91, 92, . . . (except for the ones located at both edges). The operation waveform of the selective activation circuit 300 is shown in FIG. 13.

With the above configuration, when the source transistor control signal STC1, which is a bank selective signal, is activated, all of the main word drivers 80 to 87 and the sense amplifier controllers 90 to 98 are once activated regardless of the values of the pre-decode signals PX0 to PX7. As described above, because the source transistor control signal STC1 is activated in response to the issuance of the active command, all of the main word drivers 80 to 87 and the sense amplifier controllers 90 to 98 become activated once, if the active command is issued.

Thereafter, when the sense operation of the memory bank 21 is complete, because the source transistor control signal STC1 is returned to a deactivation state, only one main word driver and two sense amplifier controllers are maintained in an activation state, and the other main word drivers and the sense amplifier controllers are deactivated.

In this manner, in the second embodiment, when the active command is issued, all of the main word drivers 80 to 87 and the sense amplifier controllers 90 to 98 become activated once, which makes it possible to suppress a decrease of an access speed due to the existence of the selective activation circuit 300.

As shown in FIG. 13, a period T30 during which a level of the internal signal RASB is Low, i.e., the period during which the semiconductor memory device 10 is in an active state, is 70 microseconds. On the other hand, a period T31 from the time when the internal signal RASB make transition to a Low level to the time when the internal signal RASOKT is activated is about 20 to 30 nanoseconds. That is, the period T31 during which all of the main word drivers 80 to 87 and the sense amplifier controllers 90 to 98 become activated is considerably short as compared to the period T30 during which the semiconductor memory device 10 is in an active state. Therefore, although all of the main word drivers 80 to 87 and the sense amplifier controllers 90 to 98 are activated once in the second embodiment, an increase of the power consumption is considerably small as compared to the first embodiment. That is, a high speed access, which is higher than that in the first embodiment, can be realized, while suppressing an increase of the power consumption with respect to the first embodiment.

Figure 14:
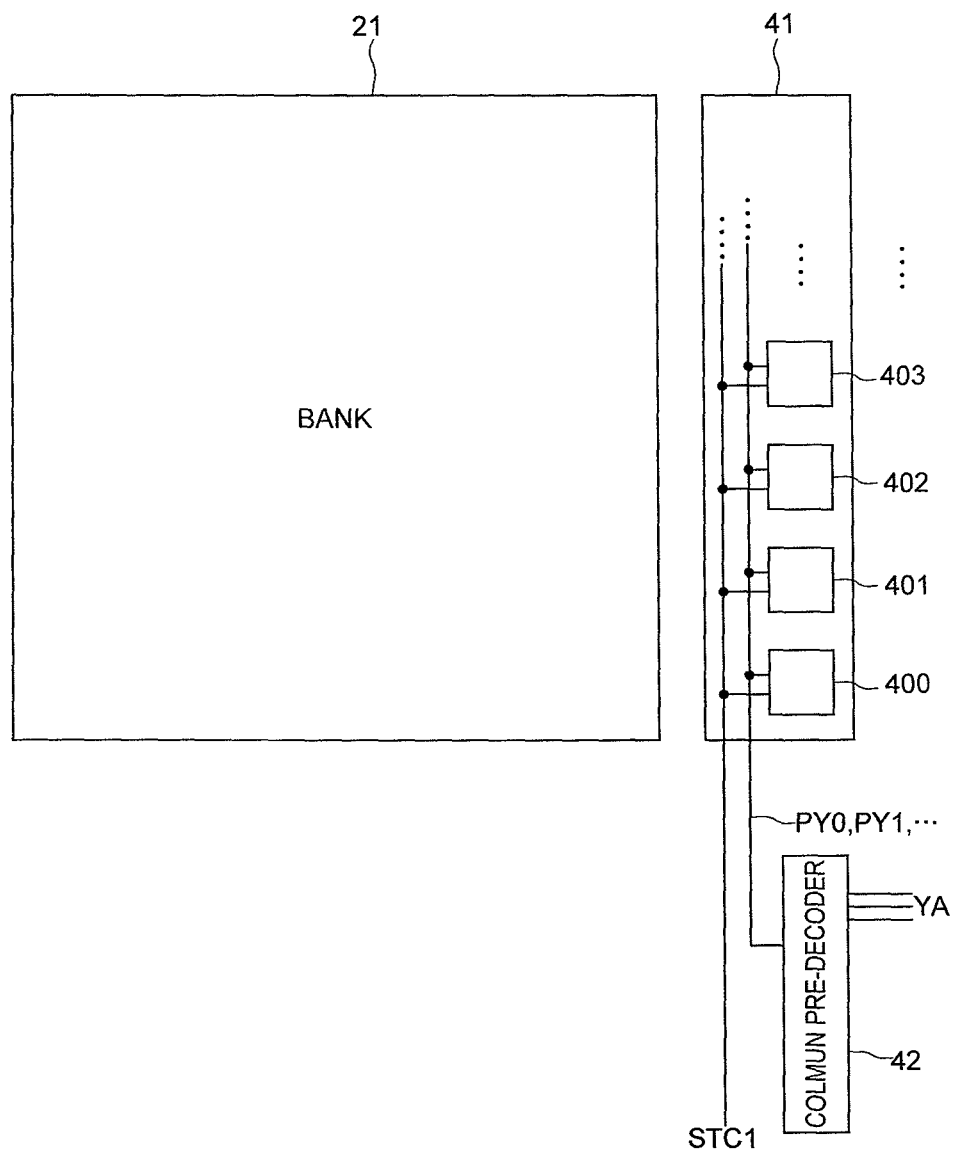
FIG. 14 is a block diagram of a semiconductor memory device according to a third embodiment of the present invention.

FIG. 14 is a block diagram of a semiconductor memory device according to a third embodiment of the present invention.

In the third embodiment, as shown in FIG. 14, a source transistor control signal STC 1 is supplied to a column select circuit group 41 that constitutes the column decoder 40. The column select circuit group 41 includes a plurality of column select circuits 400, 401, . . . , which are selected based on their corresponding pre-decode signals PY0, PY1, . . . . The pre-decode signals PY0, PY1, . . . are signals generated by pre-decoding a part of the column address YA by a column pre-decoder 42. The column select circuit group 41 and the column pre-decoder 42 form the column decoder 40 shown in FIG. 1.

In the above configuration, the column select circuits 400, 401, . . . are selectively activated based on the source transistor control signal STC1 and the pre-decode signals PY0, PY1, . . . , as it is in the first and second embodiments. Therefore, only a column select circuit that is related to a memory area of an access target is activated, and the other column select circuits are maintained in a deactivation state. In the similar manner to the first and second embodiments, the activation state indicates a state where a main power source line and a sub power source line are short-circuited in a column select circuit, and the deactivation state indicates a state where the main power source line and the sub power source line are disconnected in the column select circuit.

In this manner, selectively deactivating circuit areas that are not the access target also in the column decoder 40, the power consumption can be reduced as compared to the conventional case. Of course, by selectively deactivating circuit areas that are not the access target in both the row decoder 30 and the column decoder 40, the power consumption can be even more reduced.

When pursuing a high speed access by activating once all of the column select circuits 400, 401, . . . , in the same manner as the second embodiment, an internal signal CASB that becomes a Low level in response to issuance of a read command or a write command can be used instead of the internal signal RASB shown in FIG. 11.

It is apparent that the present invention is not limited to the above embodiments, but may be modified and changed without departing from the scope and spirit of the invention.

For example, although any one of the main word drivers is activated by the selective activation circuit 200 while deactivating all of the other main word drivers, it is not essential to deactivate all of the other main word drivers, but it suffices as at least one of the other main word drivers is deactivated.

What is claimed is:

1. A semiconductor device comprising:
a plurality of memory banks, each of the memory banks being selected when a corresponding one of bank signals takes an active level, each of the memory banks comprising:
a main power source line;
a plurality of circuit areas each comprising a logic circuit and a switch circuit coupled between the main power source line and the logic circuit, each of the circuit areas being selected when an associated one of area selective signals takes an active level; and
a plurality of gate circuits supplied at first input nodes thereof in common with the corresponding one of the bank selective signals, each of the gate circuits including a second input node supplied with an associated one of the area selective signals and an output node coupled to an associated one of the switch circuits, each of the gate circuits turning ON an associated one of the switch circuits when both of the corresponding one of the bank selective signals and the associated one of the area selective signals take the active level and turning OFF the associated one of the switch circuits when at least one of the corresponding one of the bank selective signals and the associated one of the area selective signals takes an inactive level.

2. The semiconductor device as claimed in claim 1, wherein the area selective signals include row address signals and the logic circuits of the circuit areas include word drivers.

3. The semiconductor device as claimed in claim 2, wherein the logic circuits of the circuit areas further include sense amplifier controllers.

4. The semiconductor device as claimed in claim 1, wherein the area selective signals include column address signals and the logic circuits of the circuit areas include column select circuits.

5. The semiconductor device as claimed in claim 1, wherein each of the memory banks further comprises an additional main power source line different in supplied voltage from the main power source line, and each of the circuit areas further comprises an additional switch circuit coupled between the additional main power source line and the logic circuit, each of the gate circuits turning ON an associated one of the additional switch circuits when both of the corresponding one of the bank selective signals and the associated one of the area selective signals take the active level and turning OFF the associated one of the additional switch circuits when at least one of the corresponding one of the bank selective signals and the associated one of the are selective signals takes an inactive level.

6. A semiconductor device comprising:
a plurality of memory banks, each of the memory banks including a main power source line and a plurality of circuit areas; each of the circuit areas including a sub power source line, a logic circuit coupled to the sub power source line, and a source transistor coupled between the main power source line of an associated one of the memory banks and the sub power source line; and
a control circuit configured to produce a plurality of bank selective signals in response to one or more bank address signals and a plurality of area selective signals in response to one or more area address signals, the bank selective signals being supplied to the memory banks, respectively, and the area selective signals being supplied in common to the memory banks;
each of the memory banks further including a plurality of gate circuits correspondingly to the circuit areas, the gate circuits in each of the memory banks receiving in common an associated one of the bank selective signals, each of the gates circuits in each of the memory banks further receiving an associated one of the area selective signals so that each of the gate circuits in each of the memory banks is configured to turn the source transistor of a corresponding one of the circuit areas ON when both the associated one of the bank selective signals and the associated one of the area selective signals take an active level and OFF when at least one of the associated one of the bank selective signals and the associated one of the area selective signals takes an inactive level.

7. The semiconductor device as claimed in claim 6, wherein each of the memory banks includes a memory cell array that includes a plurality of bit lines, a plurality of word lines, and a plurality of memory cells each coupled to an associated one of the bit lines and an associated one of the word lines, the area address signals including row address signals, the area selective signals including row decode signals, and the logic circuit of each of the circuit areas in each of the memory banks including a word driver circuit that drives a corresponding one of the word lines.

8. The semiconductor device as claimed in claim 6, wherein each of the memory banks includes a memory cell array that includes a plurality of bit lines, a plurality of word lines, a plurality of memory cells each coupled to an associated one of the bit lines and an associated one of the word lines, and sense amplifier circuits each coupled to an associated one of bit lines, the area address signal including row address signals, the area selective signals including row decode signals, and the logic circuit of each of the circuit areas in each of the memory banks including a sense amplifier control circuit that controls whether associated one or ones of the sense amplifier circuits are activated or inactivated.

9. The semiconductor device as claimed in claim 6, wherein each of the memory banks further includes an additional main power source line different in electrical potential from the main power source line, each of the circuit areas of each of the memory banks further including:
an additional sub power source line coupled to the logic circuit of a corresponding one of the circuit areas; and
an additional source transistor coupled between the additional main power source line of a corresponding one of the memory banks and the additional sub power source line of a corresponding one of the circuit areas;
each of the gate circuits in each of the memory banks is further configured to turn the additional source transistor of a corresponding one of the circuit areas ON when both the associated one of the bank selective signals and the associated one of the area selective signals take an active level and OFF when at least one of the associated one of the bank selective signals and the associated one of the area selective signals takes an inactive level.

10. The semiconductor device as claimed in claim 9, wherein the source transistor of each of the circuit areas in each of the memory banks is first conductivity type and the additional source transistor of each of the circuit areas in each of the memory banks is second conductivity type different from the first conductivity type.

11. The semiconductor device as claimed in claim 9, wherein the source transistor of each of the circuit areas in each of the memory banks and the additional source transistor of each of the circuit areas in each of the memory banks are configured to be turned on substantially at the same time.

12. The semiconductor device as claimed in claim 11, wherein the source transistor of each of the circuit areas in each of the memory banks and the additional source transistor of each of the circuit areas in each of the memory banks are configured to be turned off substantially at the same time.

13. The semiconductor device as claimed in claim 6, wherein the main power source line is supplied with a first voltage and the logic circuit of each of the circuit areas in each of the memory banks includes a first transistor supplied with the first voltage from the main power source line through the source transistor of a corresponding one of the circuit areas and a second transistor supplied with the first voltage directly from the main power source line without through the source transistor.

14. A semiconductor device comprising:
a plurality of memory banks, each of the memory banks including a first main power source line supplied with a first voltage, a second main power source line supplied with a second voltage different from the first voltage, and a plurality of circuit areas, each of the circuit areas including first and second sub power source lines, a P-type transistor coupled between the first main and sub power source lines,
an N-type transistor coupled between the second main and sub power source lines, and a logic circuit coupled to the first and second sub power source lines; and
a control circuit configured to produce a plurality of bank selective signals and a plurality of area selective signals;
each of the memory banks receiving an associated one of the bank selective signals and further receiving the area selective signals in parallel to each other;
each of the memory banks further including a plurality of gate circuits correspondingly to the circuit areas, each of the gate circuits in each of the memory banks including a first input node supplied with the associated one of the bank selective signals, a second input node supplied with an associated one of the area selective signals, a first output node coupled to a gate of the P-type transistor of a corresponding one of the circuit areas, and a second output node coupled to a gate of the N-type transistor of a corresponding one of the circuit areas so that each of the gate circuits in each of the memory banks is configured to turn both the P-type and N-type transistors of the corresponding one of the circuit areas ON when both the associated one of the bank selective signals and the associated one of the area selective signals take an active level and OFF when at least one of the associated one of the bank selective signals and the associated one of the area selective signals takes an inactive level.

15. The semiconductor device as claimed in claim 14, wherein each of the memory banks includes a memory cell array that includes a plurality of bit lines, a plurality of word lines, and a plurality of memory cells each coupled to an associated one of the bit lines and an associated one of the word lines, the area selective signals including row decode signals, and the logic circuit of each of the circuit areas in each of the memory banks including a word driver circuit that drives a corresponding one of the word lines.

16. The semiconductor device as claimed in claim 14, wherein each of the memory banks includes a memory cell array that includes a plurality of bit lines, a plurality of word lines, a plurality of memory cells each coupled to an associated one of the bit lines and an associated one of the word lines, and sense amplifier circuits each coupled to an associated one of bit lines, the area selective signals including row decode signals, and the logic circuit of each of the circuit areas in each of the memory banks including a sense amplifier control circuit that controls whether associated one or ones of the sense amplifier circuits are activated or inactivated.

17. The semiconductor device as claimed in claim 14, wherein the P-type transistor of each of the circuit areas in each of the memory banks and the N-type transistor of each of the circuit areas in each of the memory banks are configured to be turned on substantially at the same time.

18. The semiconductor device as claimed in claim 17, wherein the P-type transistor of each of the circuit areas in each of the memory banks and the N-type transistor of each of the circuit areas in each of the memory banks are configured to be turned off substantially at the same time.

19. The semiconductor device as claimed in claim 14, wherein the logic circuit of each of the circuit areas in each of the memory banks includes a first transistor supplied with the first voltage from the first main power source line through the P-type transistor of a corresponding one of the circuit areas, a second transistor supplied with the first voltage directly from the first main power source line without through the P-type transistor, a third transistor supplied with the second voltage from the second main power source line through the N-type transistor of the corresponding one of the circuit area, and a fourth transistor supplied with the second voltage directly from the second main power source line without through the N-type transistor.

20. The semiconductor device as claimed in claim 19, wherein the first and second transistors are P-type and the third and fourth transistors are N-type.

\* \* \* \* \*